US010886097B2

(12) United States Patent
Kubota et al.

(10) Patent No.: US 10,886,097 B2
(45) Date of Patent: Jan. 5, 2021

(54) PLASMA PROCESSING APPARATUS AND PLASMA PROCESSING METHOD

(71) Applicant: TOKYO ELECTRON LIMITED, Tokyo (JP)

(72) Inventors: Kazuhiro Kubota, Miyagi (JP); Masanobu Honda, Miyagi (JP)

(73) Assignee: TOKYO ELECTRON LIMITED, Toyko (JP)

( * ) Notice: Subject to any disclaimer, the term of this patent is extended or adjusted under 35 U.S.C. 154(b) by 42 days.

(21) Appl. No.: 15/121,075

(22) PCT Filed: Feb. 20, 2015

(86) PCT No.: PCT/JP2015/054833
§ 371 (c)(1),
(2) Date: Aug. 24, 2016

(87) PCT Pub. No.: WO2015/137094
PCT Pub. Date: Sep. 17, 2015

(65) Prior Publication Data
US 2016/0372299 A1    Dec. 22, 2016

(30) Foreign Application Priority Data

Mar. 11, 2014  (JP) ................................ 2014-048152

(51) Int. Cl.
*C23C 16/00*    (2006.01)
*H01L 21/326*    (2006.01)
(Continued)

(52) U.S. Cl.
CPC .......... *H01J 37/05* (2013.01); *H01J 37/3244* (2013.01); *H01J 37/32091* (2013.01);
(Continued)

(58) Field of Classification Search
CPC ................. H01J 37/321; H01J 37/3211; H01J 37/32119; H01J 37/32128;
(Continued)

(56) References Cited

U.S. PATENT DOCUMENTS 6,162,323 A * 12/2000 Koshimizu ......... H01J 37/3244
118/723 I
2005/0241762 A1* 11/2005 Paterson ........... H01J 37/32082
156/345.28
(Continued)

FOREIGN PATENT DOCUMENTS

CN    102194686 A    9/2011
JP    7-500459 A    1/1995
(Continued)

OTHER PUBLICATIONS

International Search Report dated May 19, 2015 in PCT/JP2015/054833.

*Primary Examiner* — Luz L Alejandro Mulero
(74) *Attorney, Agent, or Firm* — Rothwell, Figg, Ernst & Manbeck, P.C.

(57) ABSTRACT

Disclosed is a plasma processing apparatus including a processing container, an ion trapping member partitioning the inside of the processing container into a processing space and a non-processing space and transmitting radicals and trap ions, a placing table, a first gas supply unit supplying a first processing gas into the non-processing space, a second gas supply unit supplying a second processing gas into the processing space, a first high frequency power supply supplying a high frequency power to generate radicals and ions in the non-processing space, a second high frequency power supply supplying a high frequency power to generate radicals and ions in the processing space, and a third high frequency power supply supplying a high frequency power of a lower frequency than that of the high frequency power (Continued)

supplied from the second high frequency power supply to draw the ions generated in the processing space into the workpiece.

15 Claims, 9 Drawing Sheets

(51) Int. Cl.
  *H01J 37/05* (2006.01)
  *H01J 37/32* (2006.01)
  *H01L 21/311* (2006.01)
(52) U.S. Cl.
  CPC .. *H01J 37/32165* (2013.01); *H01J 37/32174* (2013.01); *H01J 37/32422* (2013.01); *H01J 37/32559* (2013.01); *H01J 37/32568* (2013.01); *H01J 37/32715* (2013.01); *H01L 21/31116* (2013.01); *H01J 2237/332* (2013.01); *H01J 2237/334* (2013.01)
(58) Field of Classification Search
  CPC .......... H01J 37/32137; H01J 37/32146; H01J 37/32155; H01J 37/32165; H01J 37/32174; H01J 37/32183

USPC ...... 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 2007/0087455 | A1* | 4/2007 | Hoffman | H01J 37/32082 438/5 |
| 2007/0246162 | A1* | 10/2007 | Paterson | H01J 37/32091 156/345.38 |
| 2008/0149592 | A1* | 6/2008 | Belen | H01J 37/321 216/41 |
| 2009/0142929 | A1* | 6/2009 | Chen | H01J 37/321 438/711 |

FOREIGN PATENT DOCUMENTS

| | | |
|---|---|---|
| JP | 11-67737 A | 3/1999 |
| KR | 10-0418239 B1 | 3/2004 |
| KR | 10-2014-0028703 A | 3/2014 |
| TW | 387097 B | 4/2000 |

\* cited by examiner

PLASMA PROCESSING APPARATUS AND PLASMA PROCESSING METHOD

CROSS REFERENCE TO RELATED APPLICATION

This application is a 35 U.S.C. 371 National Phase Entry Application from PCT/JP2015/054833, filed Feb. 20, 2015, which claims priority to Japanese Patent Application No. 2014-048152, filed Mar. 11, 2014, the disclosures of which are incorporated herein in their entirety by reference.

TECHNICAL FIELD

Various aspects and exemplary embodiments of the present disclosure relate to a plasma processing apparatus and a plasma processing method.

BACKGROUND ART

Conventionally, a plasma processing apparatus has been known in which a grid electrode formed with a plurality of through holes is provided within a processing container for processing a workpiece with plasma such that the inside of the processing container is partitioned into two spaces by the grid electrode.

This plasma processing apparatus places the workpiece on a placing table disposed in a plasma processing space below the grid electrode. Then, the plasma processing apparatus supplies a first processing gas into a non-processing space above the grid electrode, and a second processing gas into the plasma processing space. Then, the plasma processing apparatus supplies a high frequency power for changing the first processing gas into plasma so as to generate radicals in the non-processing space, and transmits the generated radicals into the plasma processing space through the grid electrode. Then, the plasma processing apparatus supplies a high frequency power for changing the second processing gas into plasma to the placing table so as to generate radicals and ions in the plasma processing space which are separate from the radicals transmitted by the grid electrode, and draw the generated ions into the workpiece. The high frequency power for changing the second processing gas into plasma is also called a bias power.

PRIOR ART DOCUMENT

Patent Document

Patent Document 1: Japanese Patent Laid-Open Publication No. 11-067737
Patent Document 2: Japanese National Publication of International Patent Application No. 07-500459

DISCLOSURE OF THE INVENTION

Problems to be Solved

However, in the above-described conventional technology, there is a problem in that it is difficult to improve a selection ratio while maintaining a desired processing characteristic of a workpiece.

That is, in the above-described conventional technology, it may be considered to increase the bias power in order to maintain a desired processing characteristic of a workpiece. In this case, with the increase of the bias power, the amounts of the radicals and the ions which are generated in the plasma processing space also increase. Hence, in the conventional technology, with the increase of the amount of the ions, etching of an etching mask included in the workpiece is accelerated, and as a result, the selection ratio of the workpiece to the etching mask may be reduced.

Meanwhile, in the above-described conventional technology, it may be considered to reduce the bias power in order to improve the selection ratio. In this case, with the reduction of the bias power, the amounts of the radicals and the ions which are generated in the plasma processing space also decrease, and furthermore, the energy of the ions to be drawn into the workpiece decreases. Hence, in the conventional technology, a processing characteristic of a workpiece such as, for example, an etching rate may be deteriorated.

Means to Solve the Problems

A plasma processing apparatus described herein, in an aspect, includes a processing container, an ion trapping member serving as a member partitioning the inside of the processing container into a processing space for processing a workpiece with plasma and a non-processing space and configured to transmit radicals and trap ions, a placing table disposed in the processing space and configured to place the workpiece thereon, a first gas supply unit configured to supply a first processing gas into the non-processing space, a second gas supply unit configured to supply a second processing gas into the processing space, a first high frequency power supply configured to supply a high frequency power for changing the first processing gas into plasma so as to generate radicals and ions in the non-processing space, a second high frequency power supply configured to supply a high frequency power for changing the second processing gas into plasma to the placing table so as to generate radicals and ions in the processing space, separately from the radicals transmitted into the processing space by the ion trapping member, and a third high frequency power supply configured to supply, to the placing table, a high frequency power of a lower frequency than that of the high frequency power supplied from the second high frequency power supply so as to draw the ions generated in the processing space into the workpiece.

Effect of the Invention

According to an aspect of the plasma processing apparatus described herein, it is possible to achieve an effect in improving a selection ratio while maintaining a desired processing characteristic of a workpiece.

DETAILED DESCRIPTION TO EXECUTE THE INVENTION

Hereinafter, exemplary embodiments of a plasma processing apparatus and a plasma processing method of the present disclosure will be described in detail with reference to the drawings. Meanwhile, the present disclosure is not limited to the exemplary embodiments. The exemplary embodiments may be appropriately combined with each other within a range that does not cause a contradiction in processing contents.

A plasma processing apparatus of the present disclosure, in an aspect, includes a processing container, an ion trapping member serving as a member partitioning the inside of the processing container into a processing space for processing a workpiece with plasma and a non-processing space and configured to transmit radicals and trap ions, a placing table disposed in the processing space and configured to place the workpiece thereon, a first gas supply unit configured to supply a first processing gas into the non-processing space, a second gas supply unit configured to supply a second processing gas into the processing space, a first high frequency power supply configured to supply a high frequency power for changing the first processing gas into plasma so as to generate radicals and ions in the non-processing space, a second high frequency power supply configured to supply a high frequency power for changing the second processing gas into plasma to the placing table so as to generate radicals and ions in the processing space, separately from the radicals transmitted into the processing space by the ion trapping member, and a third high frequency power supply configured to supply, to the placing table, a high frequency power of a lower frequency than that of the high frequency power supplied from the second high frequency power supply so as to draw the ions generated in the processing space into the workpiece.

The above-described plasma processing apparatus, in an aspect, further includes a controller configured to reduce the high frequency power supplied to the placing table from the second high frequency power supply so as to reduce an amount of the ions generated in the processing space to be within a predetermined range, and increase the high frequency power supplied to the placing table from the third high frequency power supply so as to increase energy of the ions to be drawn into the workpiece to be within a predetermined range.

In the above-described plasma processing apparatus, in an aspect, the first gas supply unit supplies an etching gas as the first processing gas into the non-processing space, and the second gas supply unit supplies a deposition gas as the second processing gas into the processing space.

In the above-described plasma processing apparatus, in an aspect, the workpiece includes an etching mask and a silicon oxide film, the silicon oxide film is etched through the etching mask thereby forming a concave portion in the silicon oxide film, and an aspect ratio of the concave portion is 40 or more.

In the above-described plasma processing apparatus, in an aspect, the etching gas includes at least one of $CF_4$, $CHF_3$, $CH_2F_2$, $C_4F_8$, $C_3F_8$, and $CH_3F$.

In the above-described plasma processing apparatus, in an aspect, the deposition gas includes at least one of $C_4F_8$, $C_4F_6$, $C_5F_8$, and $C_6F_6$.

In the above-described plasma processing apparatus, in an aspect, the ion trapping member includes a partition plate attached to an inner surface of the processing container to partition the inside of the processing container into the processing space and the non-processing space, a tubular member provided to extend from the partition plate toward the processing space and configured to transmit the radicals and trap the ions, and an electrode plate attached to the inner surface of the processing container such that the electrode plate overlaps with the partition plate with a predetermined space sandwiched therebetween in a state in which the tubular member penetrates through the processing space, and configured to include a through hole independent from the tubular member. The second gas supply unit supplies the second processing gas into the processing space through the space formed between the partition plate and the electrode plate that are disposed to overlap with each other, and the through hole of the electrode plate.

In the above-described plasma processing apparatus, in an aspect, a silicon-containing film is formed on a surface of the electrode plate that is opposite to the partition plate and faces the processing space.

A plasma processing method of the present disclosure, in an aspect, uses a plasma processing apparatus which includes a processing container, an ion trapping member serving as a member partitioning the inside of the processing container into a processing space for processing a workpiece with plasma and a non-processing space and configured to transmit radicals and trap ions, a placing table disposed in the processing space and configured to place the workpiece thereon, a first gas supply unit configured to supply a first processing gas into the non-processing space, a second gas supply unit configured to supply a second processing gas into the processing space, a first high frequency power supply configured to supply a high frequency power for changing the first processing gas into plasma so as to generate radicals and ions in the non-processing space, a second high frequency power supply configured to supply a high frequency power for changing the second processing gas into plasma to the placing table so as to generate radicals and ions in the processing space, separately from the radicals transmitted into the processing space by the ion trapping member, and a third high frequency power supply configured to supply, to the placing table, a high frequency power of a lower frequency than that of the high frequency power supplied from the second high frequency power supply so as to draw the ions generated in the processing space into the workpiece. An amount of the ions generated in the processing space is reduced to be within a predetermined range by reducing the high frequency power supplied to the placing table from the second high frequency power supply. Energy of the ions to be drawn into the workpiece is increased by increasing the high frequency power supplied to the placing table from the third high frequency power supply to be within a predetermined range.

First Exemplary Embodiment

Figure 1:
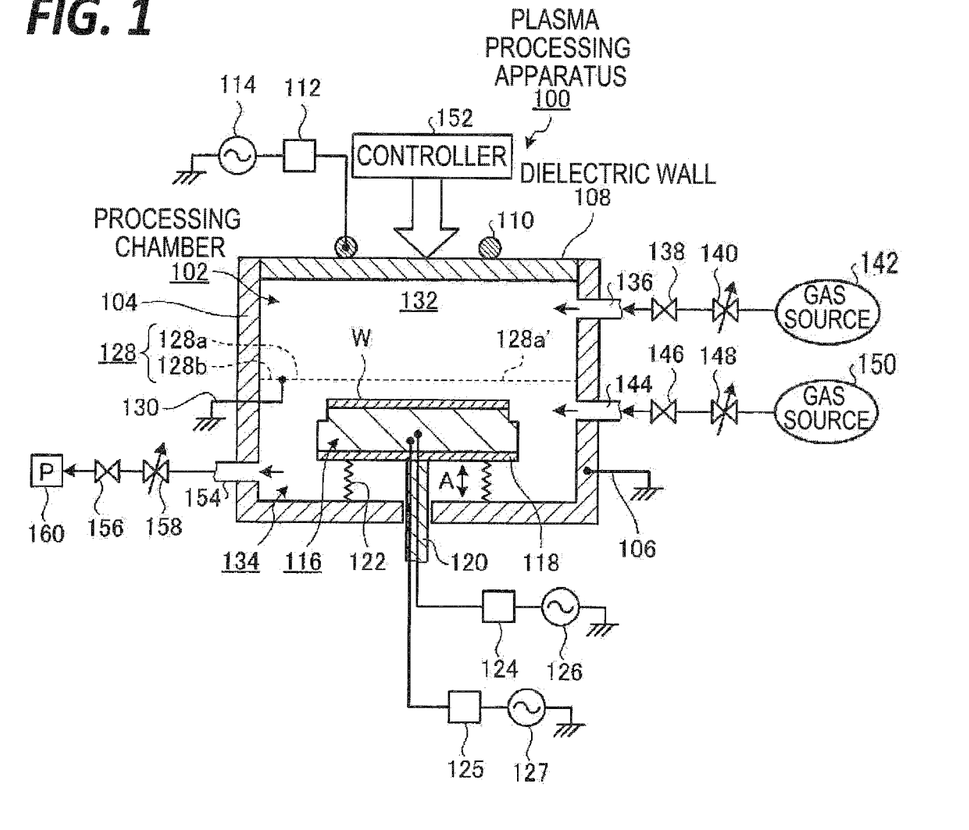
FIG. 1 is a schematic cross-sectional view illustrating a plasma processing apparatus according to a first exemplary embodiment.

A plasma processing apparatus 100 according to a first exemplary embodiment will be described with reference to FIG. 1. FIG. 1 is a schematic cross-sectional view illustrating a plasma processing apparatus according to a first exemplary embodiment. As illustrated in FIG. 1, a processing chamber 102 of the plasma processing apparatus 100 is provided within an airtight and substantially cylindrical processing container 104 which is made of a conductive material, and the processing container 104 itself is grounded by a grounding wire 106.

A dielectric wall 108 is provided in the ceiling portion of the processing chamber 102 and made of a dielectric material. A substantially annular high frequency antenna 110 is disposed in the dielectric wall 108.

In addition, a susceptor 116 is disposed in a lower portion of the processing chamber 102 and made of a conductive material to form a lower electrode. The susceptor 116 is configured to place a wafer W as a workpiece on the placing surface thereof. The susceptor 116 is an example of a placing table that is disposed in a processing space 134 to place a workpiece thereon. In addition, a lift shaft 120 is attached to the susceptor 116 through an insulating member 118 provided in the bottom portion of the susceptor 116. A lift mechanism (not illustrated) is connected to the lift shaft 120. Accordingly, the susceptor 116 is configured to freely move up and down (in the direction of the reciprocation arrow A in FIG. 1) through the lift shaft 120 by an operation of the lift mechanism. In addition, bellows 122 formed of airtight members are attached to the insulating member 118 around the lift shaft 120 and the bottom portion of the processing chamber 102 so that the airtightness within the processing container 102 is not damaged even by the up-and-down movement of the susceptor 116.

Figure 2:
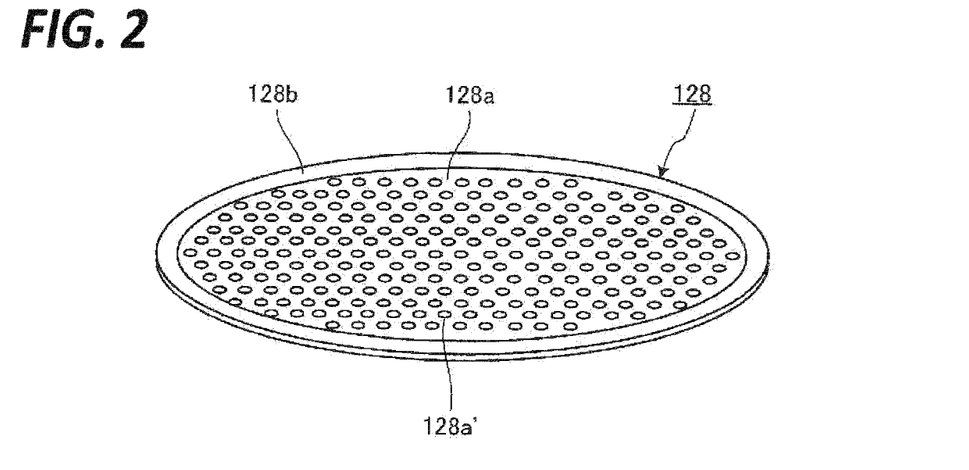
FIG. 2 is a schematic perspective view of a grid electrode of the etching apparatus illustrated in FIG. 1.

In addition, a substantially disc-shaped grid electrode 128 according to the present exemplary embodiment is disposed between the susceptor 116 within the processing chamber 102 and the dielectric wall 108. The grid electrode 128 is a member that partitions the inside of the processing container 104 into the processing space 134 configured to process a wafer W with plasma and a plasma generation space 132 which is a non-processing space. As illustrated in FIG. 2, this grid electrode 128 includes an electrode portion 128a formed of a conductive plate-shaped member in which a plurality of substantially circular through holes 128a' are formed, and an insulating portion 128b attached to the electrode portion 128a in the manner of surrounding the circumference of the electrode portion 128a. In addition, the electrode portion 128a is grounded by a grounding wire 130. The grid electrode 128 transmits radicals and traps ions by using the through holes 128a'. The grid electrode 128 is an example of an ion trapping member.

The grid electrode 128 is configured to be supported in the manner that the insulating portion 128b thereof is airtightly attached to a predetermined position in the side wall of the processing chamber 102 by an attachment means (not illustrated). Meanwhile, the position to which the grid electrode 128 is attached is set depending on, for example, a state of plasma to be excited within the processing chamber 102 or a processing condition of a wafer W. In addition, the distance between the grid electrode 128 and a wafer W placed on the susceptor 116 may be appropriately adjusted by the up-and-down movement of the susceptor 116.

Accordingly, the inside of the processing chamber 102 is configured such that, by the grid electrode, the plasma generation space 132 is formed at the dielectric wall 108 side, and the processing space 134 is formed at the susceptor 116 side. In addition, the plasma generation space 132 and the processing space 134 communicate with each other only through the through holes 128a' of the grid electrode 128.

In addition, a first gas supply pipe 136 is connected to the side wall of the plasma generation space 132 to communicate therewith and serves as a part of a processing gas supply system according to the present exemplary embodiment. A first gas supply source 142 is connected to the first gas supply pipe 136 through a first opening/closing valve 138 and a first gas flow rate regulation valve 140.

The first gas supply source 142 supplies a first processing gas into the plasma generation space 132 through the first gas supply pipe 136. For example, when a silicon oxide film included in a wafer W is etched, the first gas supply source 142 supplies an etching gas as the first processing gas into the plasma generation space 132. Details of the etching gas to be supplied into the plasma generation space 132 from the first gas supply source 142 will be described later. The first gas supply source 142 is an example of a first gas supply unit.

In addition, a second gas supply pipe 144 is connected to the side wall of the processing space 134 to communicate therewith and serves as a part of the processing gas supply system according to the present exemplary embodiment. A second gas supply source 150 is connected to the second gas supply pipe 144 through a second opening/closing valve 146 and a second gas flow rate regulation valve 148.

The second gas supply source 150 supplies a second processing gas into the processing space 134 through the second gas supply pipe 144. For example, when a silicon oxide film included in a wafer W is etched, the second gas supply source 150 supplies a deposition gas as the second processing gas into the processing space 134. The deposition gas is a processing gas which has a lower dissociation degree than that of the etching gas. Details of the deposition gas to be supplied into the processing space 134 from the second gas supply source 150 will be described later. The second gas supply source 150 is an example of a second gas supply unit.

In addition, the plasma processing apparatus 100 further includes a first high frequency power supply 114, a second high frequency power supply 126, and a third high frequency power supply 127. The first high frequency power supply 114 is connected to the high frequency antenna 110 via a first matcher 112. The first high frequency power supply 114 supplies a high frequency power, which makes into plasma the etching gas supplied into the plasma generation space 132 from the first gas supply source 142, to the high frequency antenna 110 so as to generate radicals and ions in the plasma generation space 132. Hereinafter, the high frequency power for making the etching gas into plasma will be referred to as a "first plasma generation power." The first high frequency power supply 114 supplies the first plasma generation power of for example, 13.56 MHz to the high frequency antenna 110 through the first matcher 112 so as to generate radicals and ions in the plasma generation space 132. Of the radicals and the ions generated in the plasma generation space 132, the radicals are transmitted into the processing space 134 by the grid electrode 128, and the ions are trapped by the grid electrode 128.

The second high frequency power supply 126 is connected to the susceptor 116 via a matcher 124. The second high frequency power supply 126 supplies a high frequency power, which makes into plasma the deposition gas supplied into the processing space 134 from the second gas supply source 150, to the susceptor 116 so as to generate radicals and ions in the processing space 134 separately from the radicals transmitted into the processing space 134 by the grid electrode 128. Hereinafter, the high frequency power for making the deposition gas into plasma will be referred to as a "second plasma generation power." The second high frequency power supply 126 supplies the second plasma generation power of, for example, 40 MHz or more to the susceptor 116 through the matcher 124 so as to generate radicals and ions in the processing space 134. Accordingly, the radicals transmitted into the processing space 134 by the grid electrode 128 are added to the radicals generated in the processing space 134 so that a radical/ion (Γr/Γi) ratio in the processing space 134 increases.

The third high frequency power supply 127 is connected to the susceptor 116 via a matcher 125. The third high frequency power supply 127 supplies, to the susceptor 116, a high frequency power of a lower frequency than that of the second plasma generation power supplied from the second high frequency power supply 126 so as to draw the ions generated in the processing space 134 into the wafer W. Hereinafter, the high frequency power of the lower frequency than that of the second plasma generation power will be referred to as a "bias power." The third high frequency power supply 127 supplies the bias power of, for example, 3 MHz or less to the susceptor 116 through the matcher 125 so as to draw the ions generated in the processing space 134 into the wafer W. Accordingly, energy Ei of the ions to be drawn into the wafer W increases.

In addition, an exhaust pipe 154 is connected to the side wall of the processing space 134 to communicate therewith and serves as a part of an exhaust system. An exhaust mechanism P 160 is connected to the exhaust pipe 154 via a third opening/closing valve 156 and a third pressure regulation valve 158 to exhaust the atmosphere of the processing chamber 102.

In addition, the plasma processing apparatus 100 further includes a controller 152. The controller 152 is a computer including, for example, a processor, a storage unit, an input device, and a display device, and controls the respective units of the plasma processing apparatus 100. In the controller 152, an operator may perform, for example, an input operation of a command by using the input device in order to manage the plasma processing apparatus 100, and the operation situation of the plasma processing apparatus 100 may be visually displayed by the display device. Further, the storage unit of the controller 152 stores a control program to cause a processor to control various processings performed in the plasma processing apparatus 100, or a program to cause each of the units of the plasma processing apparatus 100 to perform a processing according to a processing condition, i.e., a processing recipe.

For example, the controller 152 controls the respective units of the plasma processing apparatus 100 to perform a plasma processing method to be described later. As a specific example, the controller 152 reduces the high frequency power supplied to the susceptor 116 from the second high frequency power supply 126 so as to reduce the amount of the ions to be generated in the processing space 134 to be within a predetermined range. Further, the controller 152 increases the high frequency power supplied to the susceptor 116 from the third high frequency power supply 127 so as to reduce the energy of the ions to be drawn into the workpiece to be within a predetermined range. Here, the workpiece is, for example, a wafer W.

Figure 3:
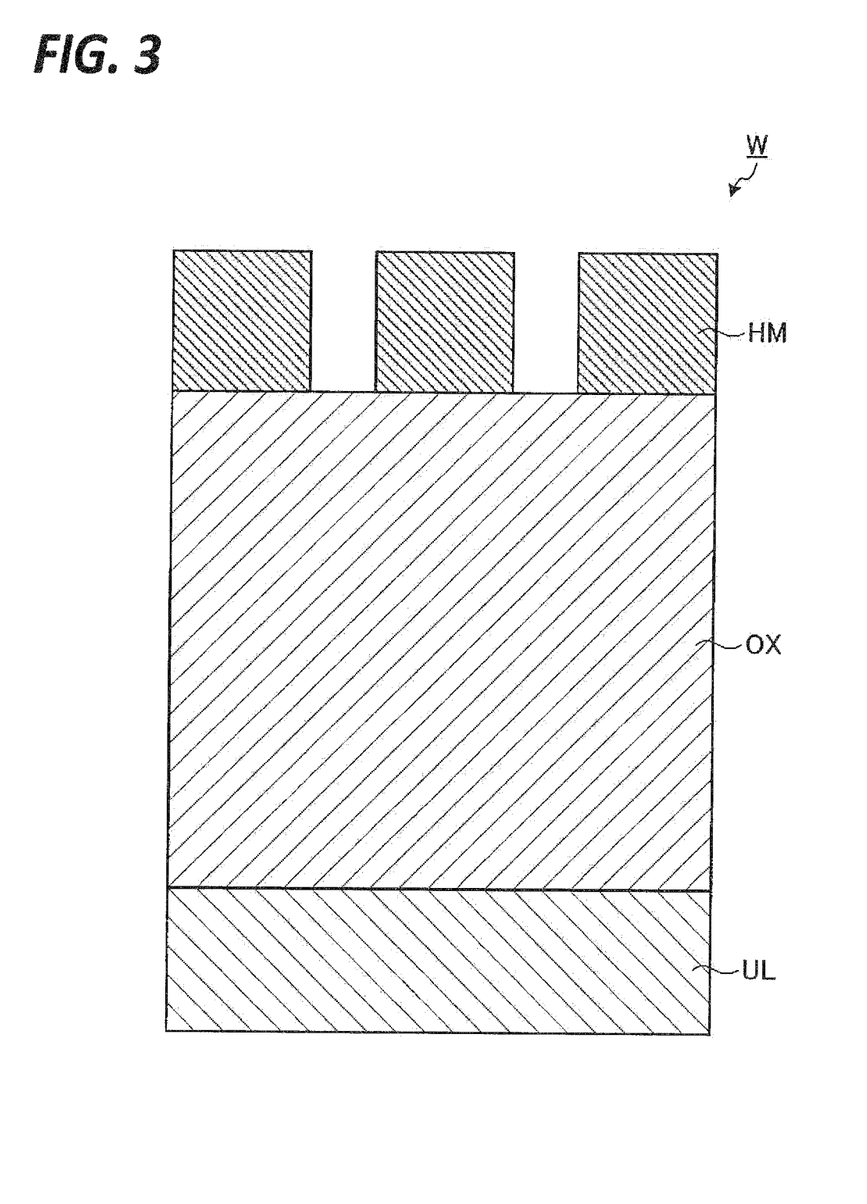
FIG. 3 is a cross-sectional view illustrating an exemplary structure of a workpiece in the first exemplary embodiment.

FIG. 3 is a cross-sectional view illustrating an exemplary structure of a workpiece in the first exemplary embodiment. As illustrated in FIG. 3, a wafer W as a workpiece is formed by an underlayer UL, a silicon oxide film OX, and a hard mask HM which are stacked in this order. An opening having a predetermined diameter is formed in the hard mask HM. The hard mask HM is an example of an etching mask.

Figure 4:
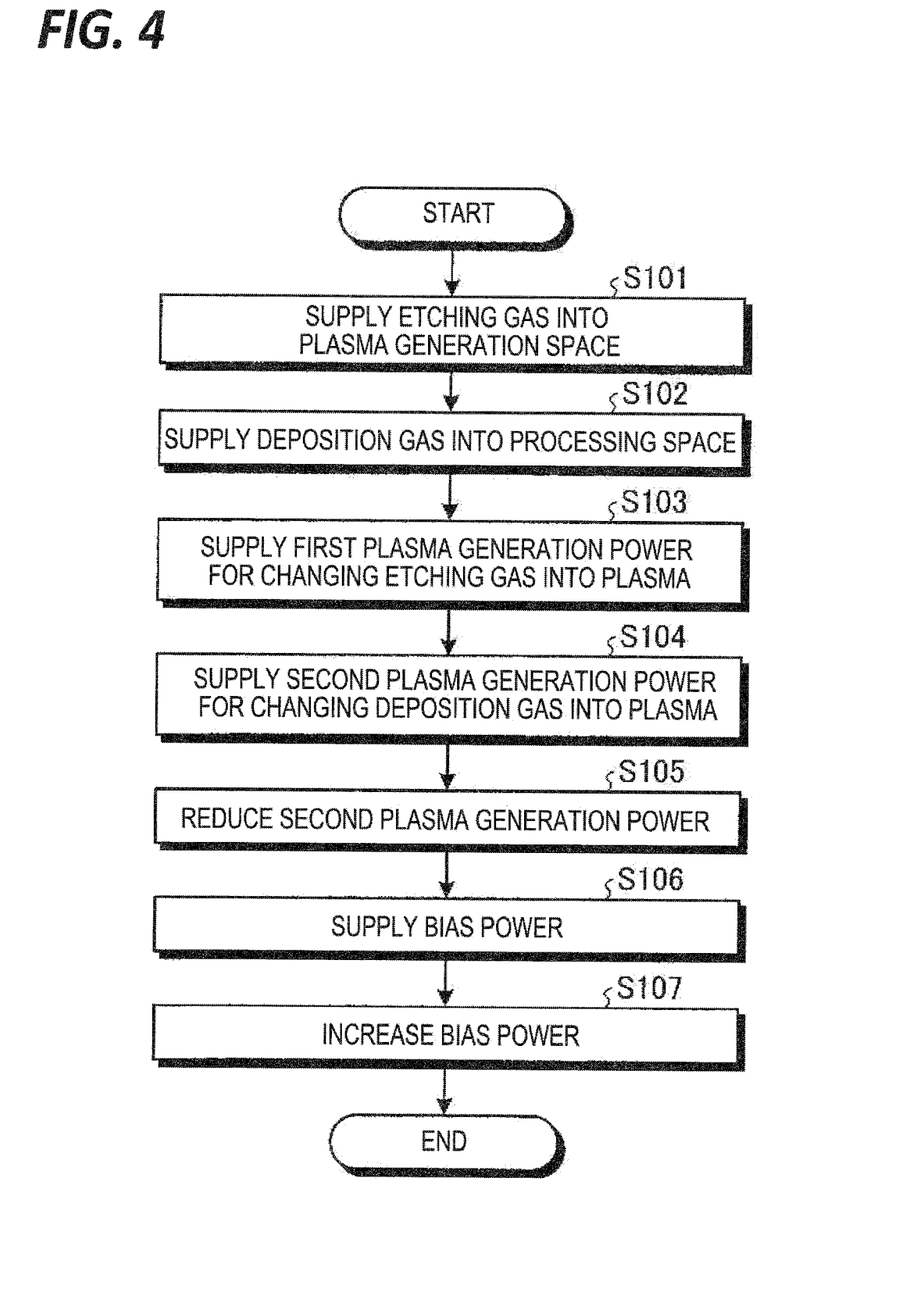
FIG. 4 is a flow chart illustrating an exemplary processing flow of a plasma processing method using the plasma processing apparatus according to the first exemplary embodiment.
Figure 5:
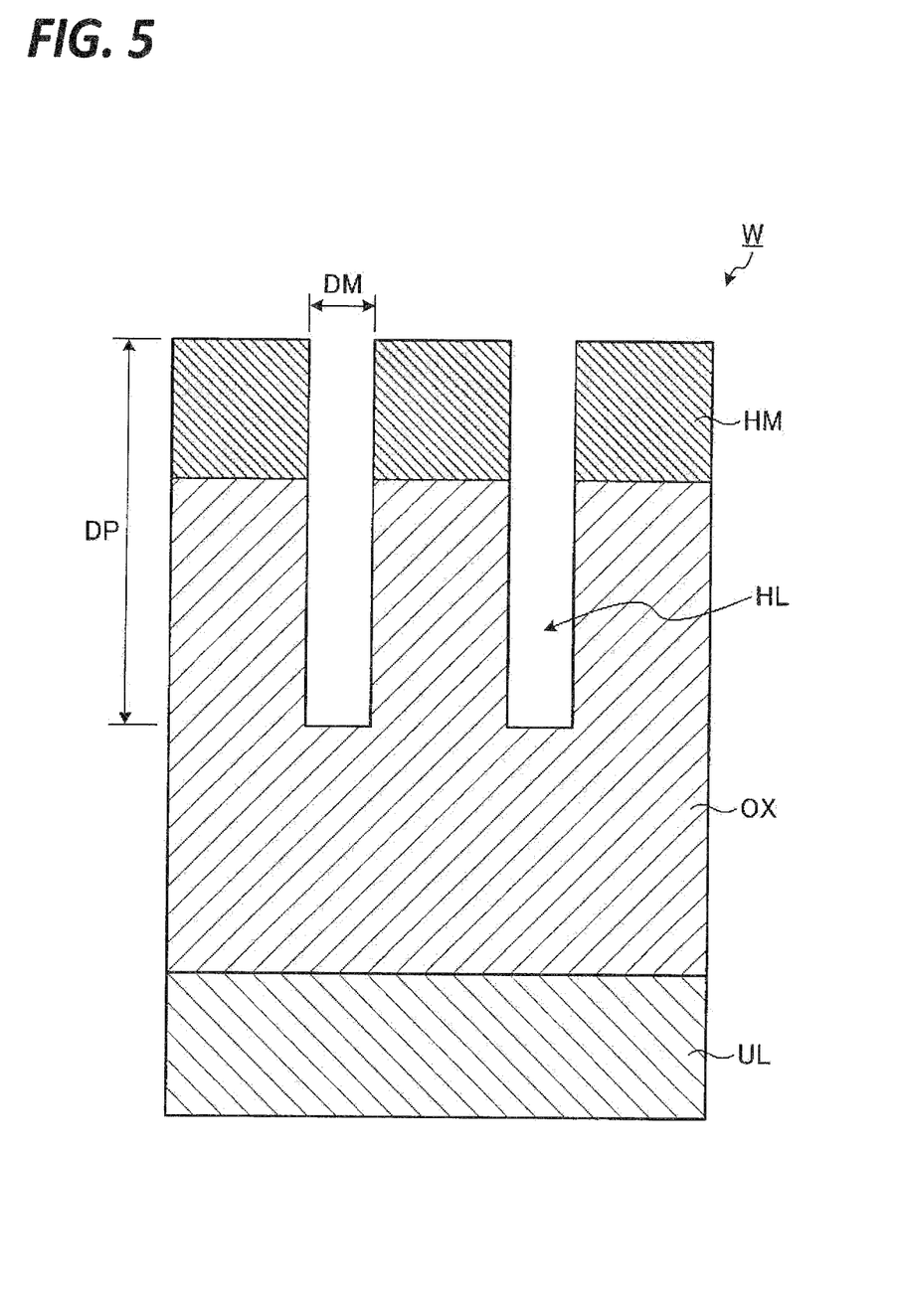
FIG. 5 is a cross-sectional view illustrating an exemplary structure of a workpiece formed by the plasma processing method using the plasma processing apparatus according to the first exemplary embodiment.

Subsequently, descriptions will be made on an exemplary flow of a plasma processing method using the plasma processing apparatus 100 according to the first exemplary embodiment. FIG. 4 is a flow chart illustrating an exemplary processing flow of a plasma processing method using the plasma processing apparatus according to the first exemplary embodiment. FIG. 5 is a cross-sectional view illustrating an exemplary structure of a workpiece formed by the plasma processing method using the plasma processing apparatus according to the first exemplary embodiment. Here, descriptions will be made on an example in which the plasma processing apparatus 100 performs a plasma etching of the silicon oxide film OX included in the wafer W illustrated in FIG. 3.

As illustrated in FIG. 4, the plasma processing apparatus 100 supplies an etching gas into the plasma generation space 132 (step S101). The etching gas includes at least one of, for example, $CF_4$, $CHF_3$, $CH_2F_2$, $C_4F_8$, $C_3F_8$, and $CH_3F$.

A more detailed example will be described. The controller 152 of the plasma processing apparatus 100 supplies the etching gas into the plasma generation space 132 from the first gas supply source 142 through the first gas supply pipe 136 by opening the first opening/closing valve 138 and the first gas flow rate regulation valve 140.

Subsequently, the plasma processing apparatus 100 supplies the deposition gas into the processing space 134 (step S102). The deposition gas includes at least one of, for example, $C_4F_8$, $C_4F_6$, $C_5F_8$, and $C_6F_6$.

A more detailed example will be described. The controller 152 of the plasma processing apparatus 100 supplies the deposition gas into the processing space 134 from the second gas supply source 150 through the second gas supply pipe 144 by opening the second opening/closing valve 146 and the second gas flow rate regulation valve 148.

Subsequently, the plasma processing apparatus 100 supplies the first plasma generation power to the high frequency antenna 110 to change into plasma the etching gas supplied into the plasma generation space 132 (step S103). The plasma processing apparatus 100 supplies the first plasma generation power of, for example 13.56 MHz to the high frequency antenna 110 through the first matcher 112.

A more detailed example will be described. The controller 152 of the plasma processing apparatus 100 supplies the first plasma generation power to the high frequency antenna 110 from the first high frequency power supply 114 so as to generate radicals and ions of the etching gas in the plasma generation space 132. Of the radicals and the ions generated in the plasma generation space 132, the radicals are transmitted into the processing space 134 by the grid electrode 128, and the ions are trapped by the grid electrode 128.

Subsequently, the plasma processing apparatus 100 supplies the second plasma generation power to the susceptor 116 to change into plasma the deposition gas supplied into the processing space 134 (step S104). The plasma processing apparatus 100 supplies the second plasma generation power of, for example, 40 MHz or more to the susceptor 116 through the matcher 124.

A more detailed example will be described. The controller 152 of the plasma processing apparatus 100 supplies the second plasma generation power to the susceptor 116 from the second high frequency power supply 126 so as to generate radicals and ions in the processing space 134, separately from the radicals transmitted into the processing space 134 by the grid electrode 128. Accordingly, the radicals transmitted into the processing space 134 by the grid electrode 128 are added to the radicals generated in the processing space 134 so that a radical/ion (Γr/Γi) ratio in the processing space 134 increases.

Subsequently, the plasma processing apparatus 100 reduces the second plasma generation power (step S105). The plasma processing apparatus 100 reduces the second plasma generation power to, for example, a power range in which a selection ratio of the silicon oxide film OX to the hard mask HM included in the wafer W is improved.

A more detailed example will be described. The controller 152 of the plasma processing apparatus 100 reduces the second plasma generation power supplied to the susceptor 116 from the second high frequency power supply 126 so as to reduce the amount of ions generated in the processing space 134 to be within a predetermined range. Accordingly, the selection ratio of the silicon oxide film OX to the hard mask HM included in the wafer W is improved. Here, when the second plasma generation power is reduced, the amount of the radicals generated in the processing space 134 is also reduced. When the amount of the radicals generated in the processing space 134 is excessively reduced, the radical/ion (Γr/Γi) ratio in the processing space 134 may be reduced. However, since the radicals transmitted into the processing space 134 by the grid electrode 128 are added to the radicals generated in the processing space 134, the radical/ion (Γr/Γi) ratio in the processing space 134 is maintained with a relatively high value.

Subsequently, the plasma processing apparatus 100 supplies the bias power of a lower frequency than that of the second plasma generation power to the susceptor 116 (step S106). The third high frequency power supply 127 supplies the bias power of, for example, 3 MHz or less to the susceptor 116 through the matcher 125.

A more detailed example will be described. The controller 152 of the plasma processing apparatus 100 supplies the bias power to the susceptor 116 from the third high frequency power supply 127 so as to draw the ions generated in the processing space 134 into the wafer W. Accordingly, the energy Ei of the ions to be drawn into the wafer W increases.

Subsequently, the plasma processing apparatus 100 increases the bias power (step S107). The plasma processing apparatus 100 increases the bias power to, for example, a power range in which the ions are drawn with respect to the silicon oxide film OX included in the wafer W.

A more detailed example will be described. The controller 152 of the plasma processing apparatus 100 increases the bias power supplied to the susceptor 116 from the third high frequency power supply 127 so as to increase the energy Ei of the ions to be drawn into the wafer W to be within a predetermined range. Accordingly, the processing characteristic of the wafer W such as, for example, an etching rate is improved.

As illustrated in FIG. 5, the silicon oxide OX film is etched by the above-described plasma processing method through the hard mask HM. Accordingly, a hole HL is formed in the silicon oxide OX film. The hole HL is an example of a concave portion. The aspect ratio of the hole HL is 40 or more. Meanwhile, when the width of the hole HL is DM, and the depth of the hole HL (i.e., the distance from the surface of the hard mask HM to the bottom of the hole HL) is DP, the aspect ratio is represented by DP/DM.

Figure 6:
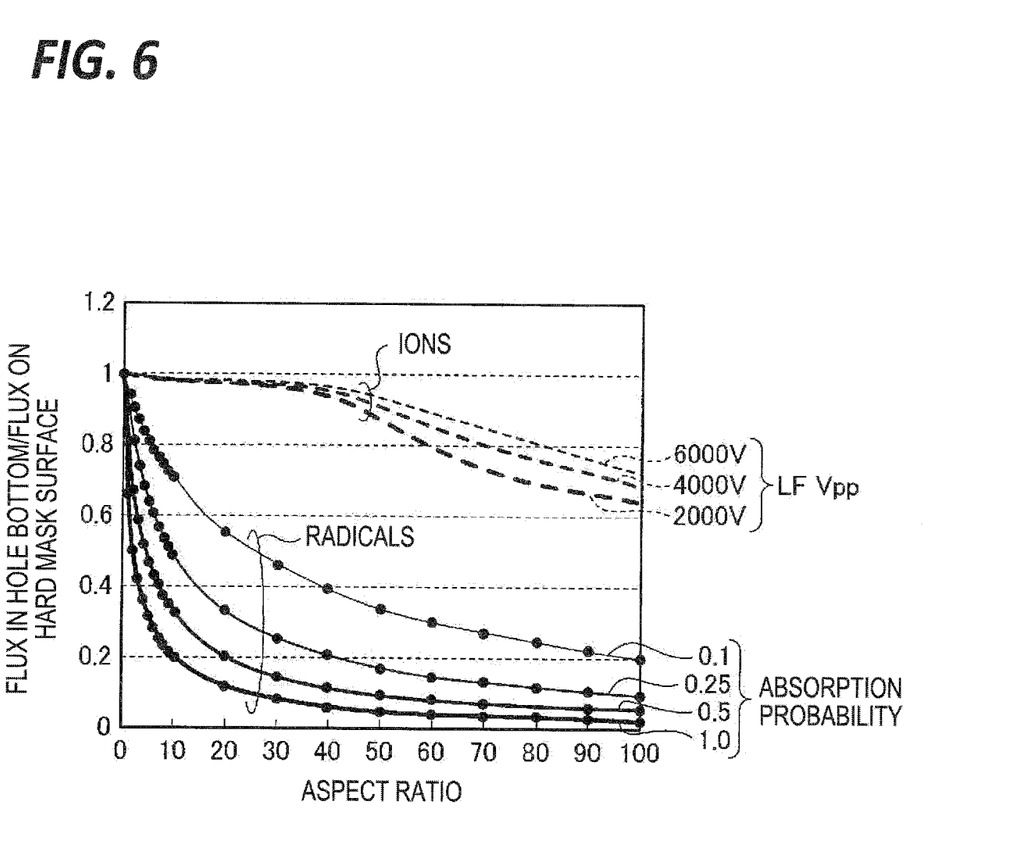
FIG. 6 is a graph illustrating a relationship between an aspect ratio and ion and radical fluxes of plasma of a fluorocarbon-based gas in a case of using a capacitively coupled plasma processing apparatus.

Subsequently, more detailed descriptions will be made on the plasma processing method using the plasma processing apparatus 100 of the first exemplary embodiment. Prior to describing the plasma processing method using the plasma processing apparatus 100 of the first exemplary embodiment, as a premise thereof, a plasma processing method using a capacitively coupled plasma processing apparatus will be described. Here, it is assumed that the capacitively coupled plasma processing apparatus supplies a high frequency bias power for plasma generation by using a single high frequency power supply. FIG. 6 is a graph illustrating a relationship between an aspect ratio and ion and radical fluxes of plasma of a fluorocarbon-based gas in a case of using the capacitively coupled plasma processing apparatus. FIG. 7 is a view illustrating behaviors of radicals and ions within a hole. The graph illustrated in FIG. 6 was obtained from data acquired by a calculation simulation. In the graph of FIG. 6, the horizontal axis represents an aspect ratio of the hole, and the vertical axis represents a value obtained by dividing the ion or radical fluxes in the bottom of the hole by the ion or radical fluxes on the surface of the hard mask.

Figure 7A:
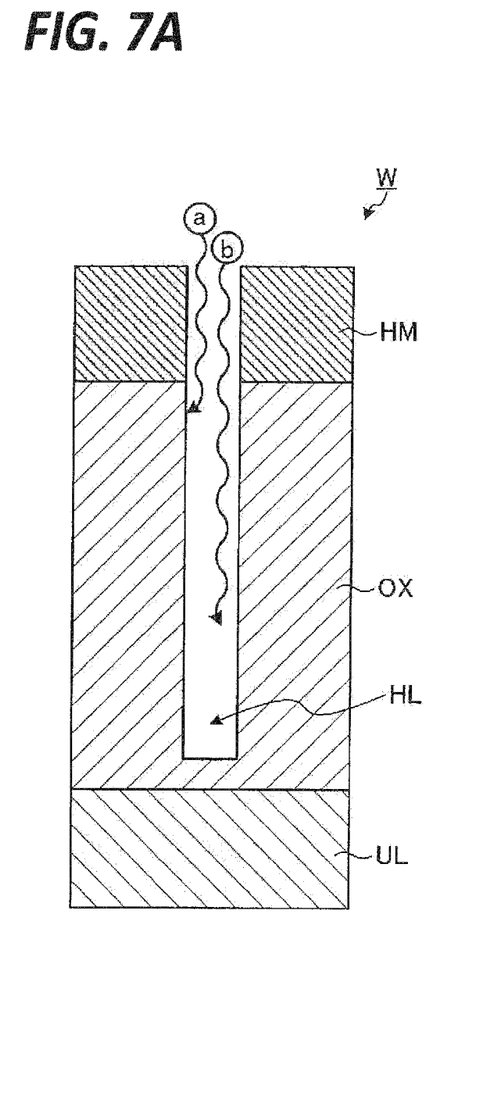
FIGS. 7A and 7B are views illustrating behaviors of radicals and ions within a hole.
Figure 7B:
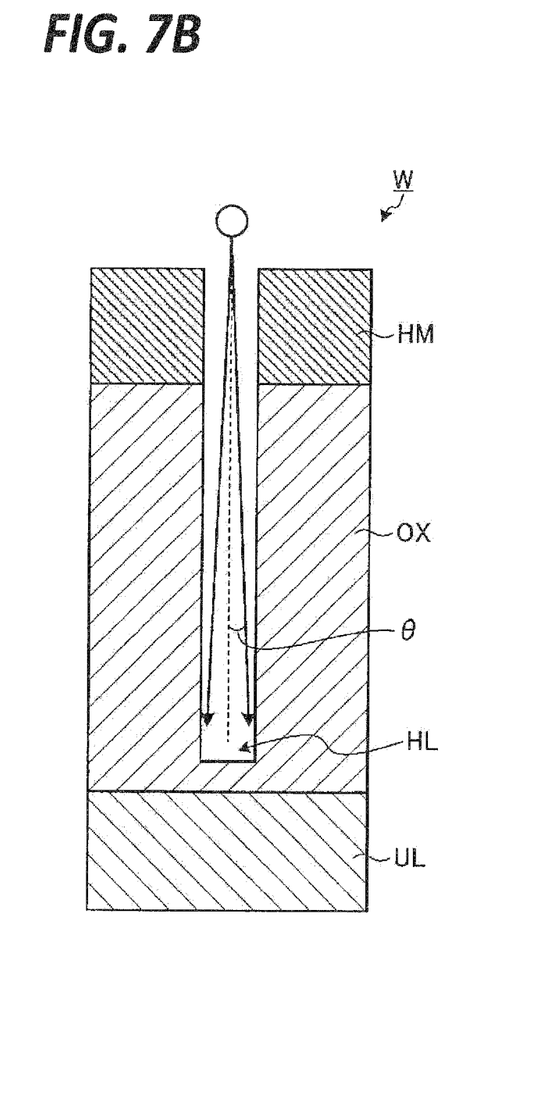

As illustrated in FIG. 6, in the capacitively coupled plasma processing apparatus, even though the aspect ratio of the hole is low, the radicals do not reach the deep portion of the hole. Further, low order radicals which have a low possibility of absorption to the side wall surfaces defining the hole may reach the deep portion of the hole, as compared to high order radicals. That is, as illustrated in FIG. 7A, the high order radicals (indicated by the circled a in FIG. 7A) are absorbed to the side wall surface of the hard mask HM or an upper portion of the side wall surface of the silicon oxide OX film which defines the hole, and do not reach the deep portion of the hole HL. Meanwhile, the low radicals (indicated by the circled b in FIG. 7A) may enter into the relatively deep portion of the hole HL.

Meanwhile, as illustrated in FIG. 6, the ions reach a deep portion of the hole when the aspect ratio of the hole is 40 or less. However, when the aspect ratio exceeds 40, the amount of the ions to reach the deep portion of the hole is reduced. In addition, as the voltage of the high frequency bias power, i.e., LF Vpp is large, the amount of the ions to reach the deep portion of the hole increases. This is because the energy of the ions increases with the increase of LF Vpp so that the distribution of the incident angle of the ions with respect to the vertical direction (the angle θ illustrated in FIG. 7B) becomes small.

Accordingly, it is believed that a hole having a high aspect ratio of 40 or more may be formed in the wafer W by increasing the energy and the flux of the ions. However, the etching rate of the hard mask HM increases with the increase of the energy and the flux of the ions. Thus, when both the energy and the flux of the ions increase, the etching rate of the hard mask HM increases. That is, an etching selection ratio of the silicon oxide OX film to the etching of the hard mask HM is reduced. Meanwhile, the etching rate of the silicon oxide OX film increases mainly according to the ion energy. Thus, in order to form the hole having a high aspect ratio of 40 or more in the wafer W while suppressing the etching of the hard mask HM, it is necessary to increase the ion energy and reduce the ion flux.

Figure 8A:
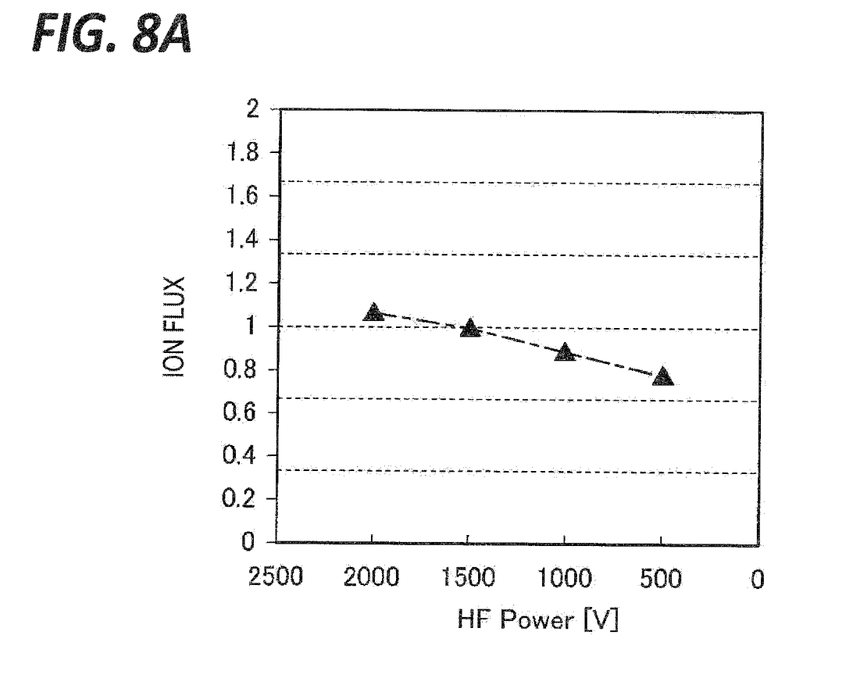
FIGS. 8A and 8B are graphs illustrating changes of plasma characteristics depending on a high frequency bias power for plasma generation, i.e., an HF power.
Figure 8B:
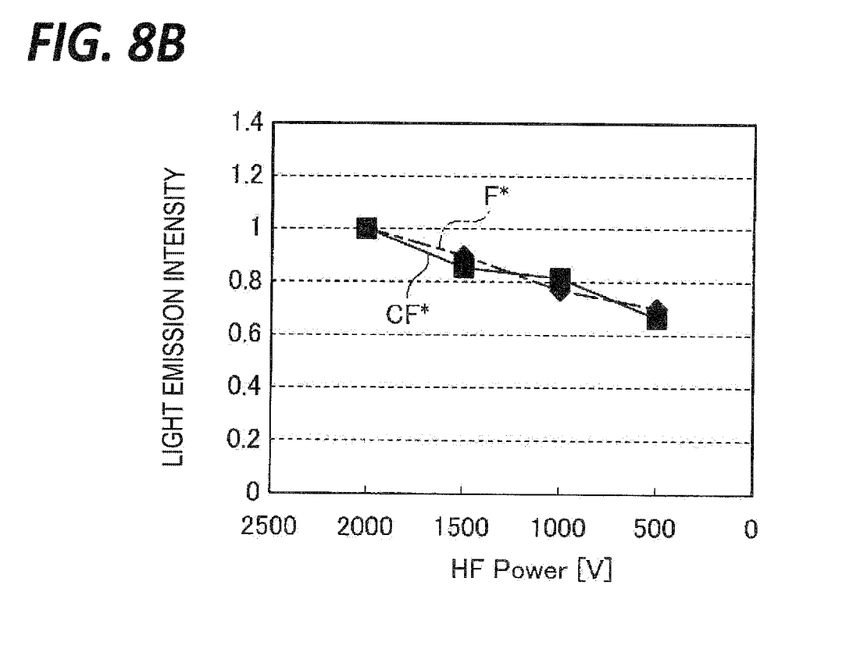

As a method of increasing the ion energy and reducing the ion flux, it may be considered to reduce the high frequency bias power for plasma generation. FIGS. 8A and 8B are graphs illustrating a change of a plasma characteristic depending on the high frequency bias power for plasma generation, i.e., the HF power.

Specifically, FIG. 8A illustrates a relationship between the HF power (horizontal axis) and the ion flux (vertical axis). FIG. 8B illustrates a relationship between the HF power (horizontal axis) and each of light emission intensity of CF radicals CF* and light emission intensity of fluorine radicals (F*). In FIG. 8B, the light emission intensity of each radical was acquired by an optical emission spectroscopy (OES). In FIG. 8B, the light emission intensity of the vertical axis is a light emission intensity normalized to a light emission intensity measured when the HF power is 2,000 W.

As illustrated in FIG. 8A, it is confirmed that when the HF power is reduced, the ion flux is reduced. However, as illustrated in FIG. 8B, when the HF power is reduced, the low order radicals such as the CF radicals and the fluorine radicals are reduced. That is, when the high frequency bias power for plasma generation is reduced, both the amount of the radicals and the amount of the ions are reduced, and the energy of the ions to be drawn into the workpiece is reduced. Hence, in the capacitively coupled plasma processing apparatus which supplies the high frequency bias power for plasma generation by using a single high frequency power supply, it is difficult to increase the ion energy and reduce the ion flux.

In contrast, the plasma processing apparatus 100 of the first exemplary embodiment adjusts the energy and the amount of the ions by independently supplying the high frequency power for plasma generation and the high frequency power for bias by means of two high frequency power supplies. That is, the plasma processing apparatus 100 of the first exemplary embodiment reduces the plasma generation power supplied to the susceptor 116 from the second high frequency power supply 126 so as to adjust the amount of the ions generated in the processing space 134 to be within a predetermined range. Further, the plasma processing apparatus 100 increases the bias power supplied to the susceptor 116 from the third high frequency power supply 127 so as to adjust the energy of the ions to be drawn into the wafer W to be within a predetermined range.

Figure 9:
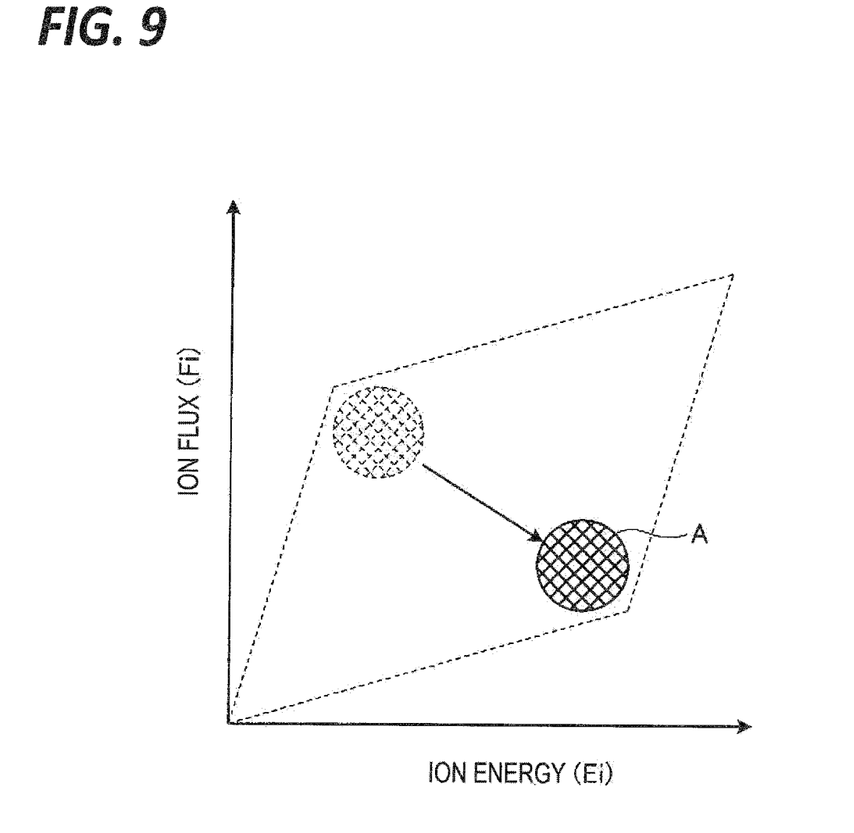
FIG. 9 is a view for explaining an example of a plasma processing method using the plasma processing apparatus according to the first exemplary embodiment.

FIG. 9 is a view for explaining an example of a plasma processing method using the plasma processing apparatus according to the first exemplary embodiment. In FIG. 9, the horizontal axis represents the energy Ei of the ions to be drawn into the wafer W, and the vertical axis represents the flux Γi of the ions in the bottom of the hole. The range A illustrated in FIG. 9 represents a range of the energy Ei and the flux Γi of the ions which is predetermined to form the hole HL having an aspect ratio of 40 or more. That is, in the range A, the ion energy Ei is relatively high, and the ion flux Γi is relatively small. The plasma processing apparatus 100 reduces the plasma generation power supplied to the susceptor 116 from the second high frequency power supply 126 so as to adjust the amount of the ions generated in the processing space 134 to be within the predetermined range. Accordingly, as illustrated in FIG. 9, the ion flux Γi in the bottom of the hole HL is reduced to the range A. Further, the plasma processing apparatus 100 increases the bias power supplied to the susceptor 116 from the third high frequency power supply 127 so as to adjust the energy of the ions to be drawn into the wafer W to be within the predetermined range. Accordingly, as illustrated in FIG. 9, the energy Ei of the ions to be drawn into the wafer W increases to the range A. Thus, the plasma processing apparatus 100 may easily increase the ion energy and easily reduce the ion flux, as compared to the capacitively coupled plasma processing apparatus which supplies the high frequency bias power for plasma generation by using a single high frequency power supply. As a result, the hole HL having the aspect ratio of 40 or more is formed in the silicon oxide OX film included in the wafer W.

As described above, in the plasma processing apparatus 100 according to the first exemplary embodiment, the grid electrode 128 partitions the inside of the processing container 104 into the processing space 134 configured to process a wafer W with plasma and the plasma generation space 132 which is a non-processing space. Then, with respect to the radicals and the ions traveling toward the processing space 134 from the plasma generation space 132, the grid electrode 128 transmits the radicals and traps the ions. Then, the second high frequency power supply 126 supplies, to the susceptor 116, a high frequency power for changing into plasma the deposition gas supplied into the processing space 134 from the second gas supply source 150 so as to generate radicals and ions in the processing space 134, separately from the radicals and the ions transmitted into the processing space 134. Then, the third high frequency power source 127 supplies, to the susceptor 116, a high frequency power of a lower frequency than that of the second plasma generation power supplied from the second high frequency power source 126 so as to draw the ions generated in the processing space 134 into the wafer W. Therefore, according to the first exemplary embodiment, it is possible to increase the ion energy and reduce the ion flux. In other words, according to the first exemplary embodiment, it is possible to suppress the etching of the hard mask HM included in the wafer W by reducing the ion flux, and increase the etching rate of the silicon oxide OX film included in the wafer W by increasing the ion energy. As a result, according to the first exemplary embodiment, the selection ratio may be improved while maintaining a desired processing characteristic of the workpiece.

In addition, the plasma processing apparatus 100 according to the first exemplary embodiment reduces the high frequency power supplied to the susceptor 116 from the second high frequency power supply 126 so as to reduce the amount of the ions generated in the processing space 134 to be within the predetermined range. Then, the plasma processing apparatus 100 increases the high frequency power supplied to the susceptor 116 from the third high frequency power supply 127 so as to increase the energy of the ions to be drawn into the workpiece to be within the predetermined range. As a result, according to the first exemplary embodiment, it is possible to easily increase the ion energy and easily reduce the ion flux, as compared to the capacitively coupled plasma processing apparatus which supplies the high frequency bias power for plasma generation by using a single high frequency power supply.

In addition, the plasma processing apparatus 100 according to the first exemplary embodiment supplies the etching gas into the plasma generation space 132 and supplies the deposition gas into the processing space 134. Hence, according to the first exemplary embodiment, a deposit may be deposited as a protecting film on the hard mask HM included in the wafer W. As a result, according to the first exemplary embodiment, the selection ratio of the silicon oxide OX film to the hard mask HM may be further improved.

In addition, in the first exemplary embodiment, the aspect ratio of the hole HL formed in the silicon oxide OX film is 40 or more. As a result, according to the first exemplary embodiment, it is possible to cope with the so-called high aspect ratio contact (HARC) process.

In addition, in the first exemplary embodiment, the etching gas includes at least one of $CF_4$, $CHF_3$, $CH_2F_2$, $C_4F_8$, $C_3F_8$, and $CH_3F$. As a result, according to the first exemplary embodiment, it is possible to effectively etch the silicon oxide OX film included in the wafer W by using an etching gas having a relatively low attachment coefficient.

In addition, in the first exemplary embodiment, the deposition gas includes at least one of $C_4F_8$, $C_4F_6$, $C_5F_8$, and $C_6F_6$. As a result, according to the first exemplary embodiment, the selection ratio of the silicon oxide OX film to the hard mask HM may be further improved.

Second Exemplary Embodiment

Figure 10:
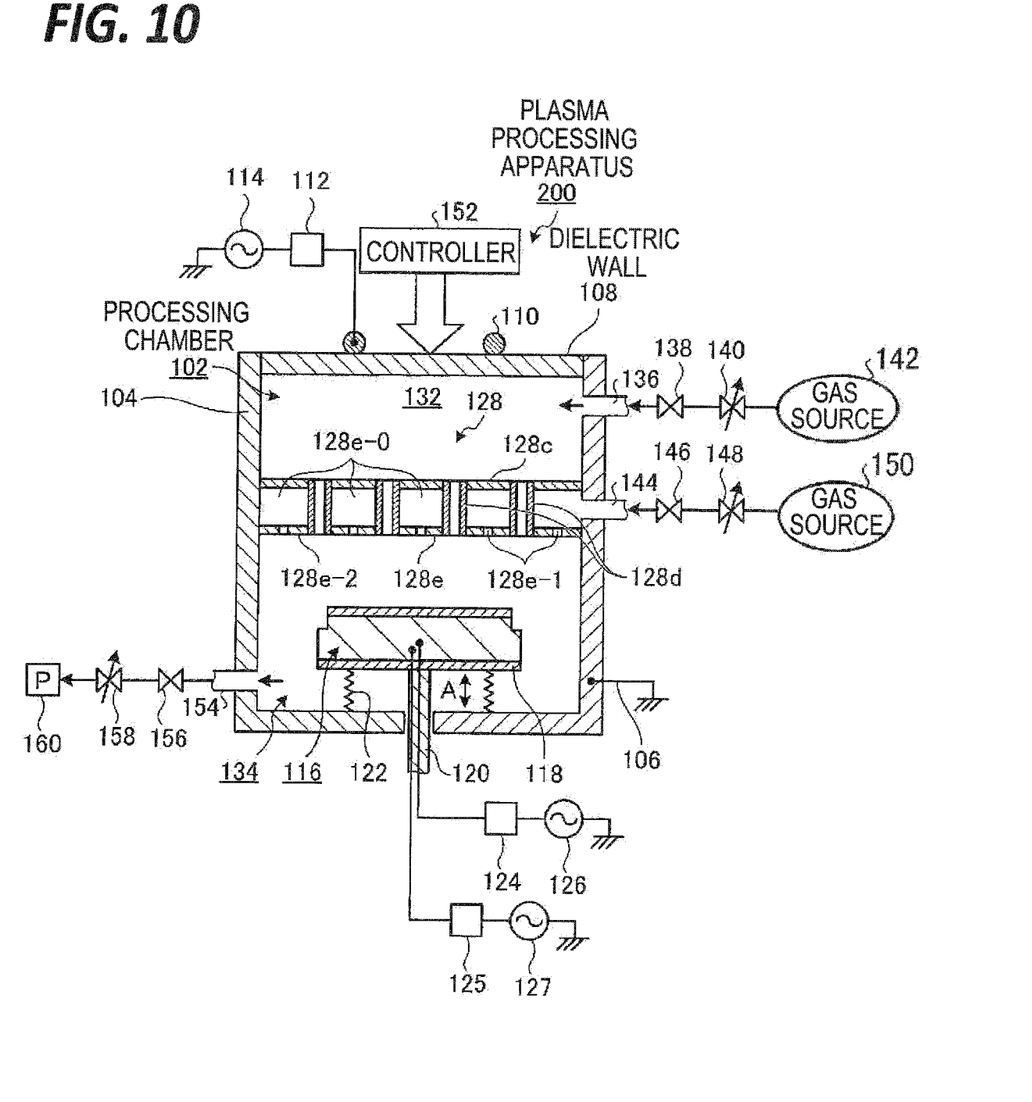
FIG. 10 is a schematic cross-sectional view illustrating a plasma processing apparatus according to a second exemplary embodiment.

Subsequently, a plasma processing apparatus 200 according to a second exemplary embodiment will be described with reference to FIG. 10. FIG. 10 is a schematic cross-sectional view illustrating a plasma processing apparatus according to a second exemplary embodiment. The plasma processing apparatus according to the second exemplary embodiment is different from the plasma processing apparatus 100 illustrated in FIG. 1 merely in terms of, for example, the structure of the grid electrode 128 and the supply form of the second processing gas, and is identical thereto in terms of other configurations. Thus, descriptions of the configurations identical to those of the plasma processing apparatus 100 illustrated in FIG. 1 will be omitted.

As illustrated in FIG. 10, in the plasma processing apparatus 200 according to the second exemplary embodiment, the grid electrode 128 includes a partition plate 128c, a tubular member 128d, and an electrode plate 128e.

The partition plate 128c is attached to the inner surface of the processing container 104 to partition the processing container 104 into the processing space 134 and the plasma generation space 132 which is a non-processing space.

The tubular member 128d extends from the partition plate 128c toward the processing space 134. The tubular member 128d transmits radicals and traps ions by using internal holes thereof.

The electrode plate 128e is attached to the inner surface of the processing container 104 such that the electrode plate 128e overlaps with the partition plate 128c with a predetermined space sandwiched therebetween in a state in which the tubular member 128d penetrates through the processing space 134. The electrode plate 128e includes through holes 128e-1 which are separate from those of the tubular member 128d. The through holes 128e-1 allow a space 128e-0 formed between the partition plate 128c and the electrode plate 128e that are disposed to overlap with each other to communicate with the processing space 134.

A silicon-containing film 128e-2 is formed on the surface of the electrode plate 128e which is opposite to the partition plate 128c and faces the processing space 134.

In addition, a second gas supply pipe 144 communicates with the space 128e-0 formed between the partition plate 128c and the electrode plate 128e that are disposed to overlap with each other. A second gas supply source 150 is connected to the second gas supply pipe 144 via a second opening/closing valve 146 and a second gas flow rate regulation valve 148.

The second gas supply source 150 supplies a second processing gas into the processing space 134 through the second gas supply pipe 144, the space 128e-0, and the through holes 128e-1 of the electrode plate 128e. For example, when the silicon oxide film included in the wafer W is etched, the second gas supply source 150 supplies the deposition gas as the second processing gas into the processing space 134.

As described above, in the plasma processing apparatus 200 according to the second exemplary embodiment, the second gas supply source 150 supplies the deposition gas into the processing space 134 through the space 128e-0 formed between the partition plate 128c and the electrode plate 128e that are disposed to overlap with each other, and the through holes 128e-1 of the electrode plate 128e. In a state in which the deposition gas is uniformly diffused in the space 128e-0, the deposition gas is introduced into the processing space 134 through the through holes 128e-1 of the electrode plate 128e. Hence, according to the second exemplary embodiment, a deposit may be uniformly deposited as a protecting film on the hard mask HM included in the wafer W. As a result, according to the second exemplary embodiment, the selection ratio of the silicon oxide OX film to the hard mask HM may be further improved.

In addition, in the plasma processing apparatus 200 according to the second exemplary embodiment, the silicon-containing film 128e-2 is formed on the surface of the electrode plate 128e which is opposite to the partition plate 128c and faces the processing space 134. As a result, according to the second exemplary embodiment, it is possible to trap the fluorine radicals, as $SiF_4$, which cause the reduction of the selection ratio of the silicon oxide OX film to the hard mask HM. Meanwhile, in the above-described exemplary embodiments, the plasma in the plasma generation space 132 is inductively coupled plasma, but is not limited thereto. The plasma in the plasma generation space 132 may be capacitively coupled plasma or microwave plasma.

DESCRIPTION OF SYMBOLS 100, 200: plasma processing apparatus, 102: processing chamber, 104: processing container, 108: dielectric wall, 110: high frequency antenna, 114: first high frequency power supply, 116: susceptor (lower electrode), 126: second high frequency power supply, 127: third high frequency power supply, 128: grid electrode, 132: plasma generation space, 134: processing space, 136: first gas supply pipe, 140: first gas flow rate regulation valve, 142: first gas supply source, 144: second gas supply pipe, 148: second gas flow rate regulation valve, 150: second gas supply source, 152: controller, 154: exhaust pipe, 160: exhaust mechanism, W: wafer

What is claimed is:

1. A plasma processing apparatus, comprising:
a processing container;
an ion trapping member serving as a member partitioning an inside of the processing container into a processing space for processing a workpiece with plasma and a non-processing space and configured to transmit radicals and trap ions;
a placing table made of conductive material and disposed in the processing space and configured to place the workpiece thereon;
a first gas supply source configured to supply a first processing gas into the non-processing space;
a second gas supply source configured to supply a second processing gas into the processing space;
a controller which includes a processor and controls the plasma processing apparatus;
a first high frequency power source configured to supply a first high frequency power, wherein the controller is configured to control the first high frequency power source to generate radicals and ions in the non-processing space, with the first high frequency power changing the first processing gas into plasma;
a second high frequency power source configured to supply a second high frequency power towards the placing table, wherein the controller is configured to control the second high frequency power source to generate radicals and ions in the processing space, separately from the radicals transmitted into the processing space by the ion trapping member, with the second high frequency power changing the second processing gas into plasma;
a third high frequency power source configured to supply, to the placing table, a third high frequency power of a lower frequency than that of the second high frequency power supplied from the second high frequency power source, and wherein the controller is configured to control the third high frequency power source to draw the ions generated in the processing space into the workpiece; and
wherein the controller is further configured to reduce the second high frequency power so as to reduce an amount of the ions generated in the processing space to be within a first predetermined range, and increase the third high frequency power so as to increase energy of the ions drawn into the workpiece to be within a second predetermined range,
wherein the workpiece includes an etching mask and a silicon oxide film,
wherein the first predetermined range and the second predetermined range are selected to control an etch selection ratio between the etching mask and the silicon oxide film;
wherein the controller is further configured to:
begin supply of the second high frequency power while the first high frequency power is being supplied;
reduce the second high frequency power after beginning supply of the second high frequency power until the amount of the ions generated in the processing space is within the first predetermined range;
begin supply of the third high frequency power after reducing the second high frequency power; and
increase the third high frequency power after beginning supply of the third high frequency power until the energy of the ions drawn into the workpiece is within the second predetermined range.

2. The plasma processing apparatus of claim 1, wherein the first gas supply source supplies an etching gas as the first processing gas into the non-processing space, and the second gas supply source supplies a deposition gas as the second processing gas into the processing space.

3. The plasma processing apparatus of claim 2, wherein the etching gas supplied by the first gas supply source includes at least one of $CF_4$, $CHF_3$, $CH_2F_2$, $C_4F_8$, $C_3F_8$, and $CH_3F$.

4. The plasma processing apparatus of claim 2, wherein the deposition gas supplied by the second gas supply source includes at least one of $C_4F_8$, $C_4F_6$, $C_5F_8$, and $C_6F_6$.

5. The plasma processing apparatus of claim 1, wherein the controller is configured to control the apparatus such that the silicon oxide film is etched through the etching mask thereby forming a concave portion in the silicon oxide film, and an aspect ratio of the concave portion is 40 or more.

6. The plasma processing apparatus of claim 1, wherein the ion trapping member includes:
a partition plate attached to an inner surface of the processing container to partition the inside of the processing container into the processing space and the non-processing space;
a tubular member provided to extend from the partition plate toward the processing space and configured to transmit the radicals and trap the ions; and
an electrode plate attached to the inner surface of the processing container such that the electrode plate overlaps with the partition plate with a predetermined space sandwiched therebetween in a state in which the tubular member penetrates through the processing space, and configured to include a through hole independent from the tubular member, and
the second gas supply source supplies the second processing gas into the processing space through the space formed between the partition plate and the electrode plate that are disposed to overlap with each other, and the through hole of the electrode plate.

7. The plasma processing apparatus of claim 6, wherein a silicon-containing film is formed on a surface of the electrode plate that is opposite to the partition plate and faces the processing space.

8. The plasma processing apparatus of claim 1, wherein the controller is configured to suppress the etching of the etching mask by reducing the second high frequency power of the second high frequency power supply source until the amount of the ions generated in the processing space is within the first predetermined range.

9. The plasma processing apparatus of claim 1, wherein the controller is configured to increase the etching of the silicon oxide film by increasing the third high frequency power of the third high frequency power supply source until the energy of the ions drawn into the workpiece is within the second predetermined range.

10. The plasma processing apparatus of claim 1, wherein the second high frequency power supply source has a frequency higher than a frequency of the first high frequency power supply source.

11. The plasma processing apparatus of claim 10, wherein the second high frequency power supply source has a frequency of 40 MHz or higher, and the third power supply source has a frequency of 3 MHz or lower.

12. The plasma processing apparatus of claim 1, wherein the controller is configured to control the second and third power supplies such that after reducing the second high frequency power and beginning supply of the third high frequency power, power continues to be supplied by the second high frequency power supply source such that radicals and ions are generated by the second high frequency power supply source from the second processing gas in the processing space.

13. The plasma processing apparatus according to claim 1, wherein the controller is further configured to:
commence supply of the second processing gas after commencement of the supply of the first processing gas; and
control the second and third high frequency power supplies to decrease an incident angle of ions and increase a proportion of ions reaching a bottom of an etched feature.

14. A plasma processing apparatus, comprising:
a processing container;
an ion trapping member serving as a member partitioning the inside of the processing container into a processing space for processing a workpiece with plasma and a non-processing space and configured to transmit radicals and trap ions;
a placing table made of conductive material and disposed in the processing space and configured to place the workpiece thereon;
a first gas supply source configured to supply a first processing gas into the non-processing space;
a second gas supply source configured to supply a second processing gas into the processing space;
a controller which includes a processor, and wherein the controller is configured to control the plasma processing apparatus;

a first high frequency power supply source configured to supply a first high frequency power, wherein the controller is configured to control the first high frequency power supply source to generate radicals and ions in the non-processing space, with the first high frequency power changing the first processing gas into plasma;

a second high frequency power supply source configured to supply a second high frequency power towards the placing table, wherein the controller is configured to control the second high frequency power supply source to generate radicals and ions in the processing space, separately from the radicals transmitted into the processing space by the ion trapping member, with the second high frequency power changing the second processing gas into plasma; and a third high frequency power supply source configured to supply, to the placing table, a third high frequency power of a lower frequency than that of the second high frequency power supplied from the second high frequency power supply source, and wherein the controller is configured to control the third high frequency power supply source to draw the ions generated in the processing space into the workpiece; and wherein the controller is further configured to control the first and second gas supply sources and the first and second high frequency power supplies such that:

the supply of the second processing gas commences after the supply of the first processing gas; and the supply of the second high frequency power commences after commencement of the supply of the first high frequency power and while first high frequency power continues to be supplied;

wherein the controller is further configured to:

commence supply of the third high frequency power after commencement of the supply of the second high frequency power and while power continues to be supplied by the second high frequency power supply source;

after commencement of the supply of the third high frequency power and while power is supplied by both the second high frequency power supply source and the third high frequency power supply source, increase power supplied by the third high frequency power supply source or decrease power supplied by the second high frequency power supply source to decrease an incident angle of ions and increase a proportion of ions reaching a bottom of an etched feature; and to both increase power supplied by the third high frequency power supply source and decrease power supplied by the second high frequency power supply source while power is supplied by both the second and third power supply sources and thereby decrease an amount of ions generated in the processing space while increasing energy of ions drawn into the workpiece.

15. The plasma processing apparatus of claim 14, wherein the second high frequency power supply source has a frequency of 40 MHz or higher, and the third high frequency power supply source has a frequency of 3 MHz or lower, and further wherein a frequency of the first high frequency power supply source is lower than that of the second high frequency power supply source.

* * * * *